(12) United States Patent
Sirito-Olivier et al.

(10) Patent No.: US 11,823,750 B2
(45) Date of Patent: Nov. 21, 2023

(54) ONE-TIME PROGRAMMABLE MEMORY AND METHOD FOR VERIFICATION AND ACCESS

(71) Applicants: STMicroelectronics (Alps) SAS, Grenoble (FR); STMicroelectronics S.r.l., Agrate Brianza (IT)

(72) Inventors: Philippe Sirito-Olivier, St Egreve (FR); Giovanni Luca Torrisi, Catania (IT)

(73) Assignees: STMICROELECTRONICS (ALPS) SAS, Grenoble (FR); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/244,450

(22) Filed: Apr. 29, 2021

(65) Prior Publication Data

US 2021/0375377 A1    Dec. 2, 2021

(30) Foreign Application Priority Data

May 29, 2020    (FR) ...................... 2005719

(51) Int. Cl.
| | | |
|---|---|---|
| *G11C 17/00* | (2006.01) | |
| *G11C 16/34* | (2006.01) | |
| *G11C 16/10* | (2006.01) | |
| *G11C 16/26* | (2006.01) | |
| *G11C 16/30* | (2006.01) | |

(52) U.S. Cl.
CPC ........ *G11C 16/3454* (2013.01); *G11C 16/105* (2013.01); *G11C 16/26* (2013.01); *G11C 16/30* (2013.01); *G11C 17/00* (2013.01)

(58) Field of Classification Search
CPC ......... G11C 17/00; G11C 17/08; G11C 17/12; G11C 17/14; G11C 17/143; G11C 17/16; G11C 17/18; G11C 17/165
See application file for complete search history.

(56) References Cited

U.S. PATENT DOCUMENTS

| | | | |
|---|---|---|---|
| 2014/0215294 A1 | 7/2014 | Kim et al. | |
| 2018/0025982 A1* | 1/2018 | Hall ............. | H01L 23/5256 257/529 |
| 2020/0104221 A1 | 4/2020 | Kost et al. | |
| 2021/0248048 A1* | 8/2021 | Chih ............. | G11C 17/18 |
| 2021/0375377 A1* | 12/2021 | Sirito-Olivier .... | G11C 16/3454 |

FOREIGN PATENT DOCUMENTS

WO    2008143815 A1    11/2008

* cited by examiner

*Primary Examiner* — Alfredo Bermudez Lozada
(74) *Attorney, Agent, or Firm* — Slater Matsil, LLP (57) ABSTRACT

A method for writing into a one-time programmable memory of an integrated circuit includes attempting, by a memory control circuit of the integrated circuit, to write data in at least one first register of the one-time programmable memory; verifying, by the memory control circuit, whether the data has been correctly written in the at least one first register; and, in case the data has not been correctly written in the at least one first register, attempting, by the memory control circuit, to write the data in at least one second register of the one-time programmable memory.

21 Claims, 6 Drawing Sheets

ONE-TIME PROGRAMMABLE MEMORY AND METHOD FOR VERIFICATION AND ACCESS

CROSS-REFERENCE TO RELATED APPLICATIONS

This application claims the benefit of French Application No. 2005719, filed on May 29, 2020, which application is hereby incorporated herein by reference.

TECHNICAL FIELD

The present disclosure relates generally to electronic devices and, more specifically, to electronic devices comprising memories and to methods for writing thereto.

BACKGROUND

For many applications, it may be desirable to provide memories that can be programmed once in order to configure or customize operation of an electronic device throughout its lifetime. Some types of memories for such applications may allow data to be rewritten multiple times to the same memory cells. Examples include multiple-time programmable (MTP) memories, such as for example electrically-erasable programmable read-only memories (EEPROM) or flash memories, and few-time programmable (FTP) memories. While such technologies reduce the impact of possible errors or mistakes made during the configuration of the corresponding devices, they tend to be expensive due to their physical implementation and electrical testing features.

Another type of memory is the so-called "one-time programmable" (OTP) memory, which has the advantage of having a lower cost. However, as its name suggests, an OTP can only be programmed once, whereas for some applications it would be desirable to provide a more versatile solution.

SUMMARY

There is a need to improve the programming of electronic devices comprising one-time programmable memories.

One embodiment addresses all or some of the drawbacks of known electronic devices comprising one-time programmable memories.

One embodiment provides a method for writing into a one-time programmable memory of an integrated circuit, the method comprising attempting, by a memory control circuit of the integrated circuit, to write data in at least one first register of the one-time programmable memory; verifying, by the memory control circuit, whether the data has been correctly written in the at least one first register; and, in case the data has not been correctly written in the at least one first register, attempting, by the memory control circuit, to write the data in at least one second register of the one-time programmable memory.

According to one embodiment, the method comprises, after attempting to write the data in the at least one second register, verifying, by the memory control circuit, whether the data has been correctly written in the at least one second register.

According to one embodiment, the data comprises a verification code, the method further comprising calculating the verification code by the memory control circuit prior to attempting to write the data in the at least one first register, and wherein verifying whether the data has been correctly written in the at least one first register comprises verifying, by the memory control circuit, a value of the verification code written in the at least one first register.

According to one embodiment, verifying whether the data has been correctly written in the at least one first register comprises measuring, for at least some of the memory cells of the at least one first register, an electrical value, and comparing each measured electrical value with at least one threshold.

One embodiment provides a method for reading a one-time programmable memory of an integrated circuit, the method comprising verifying, by a memory control circuit, whether data has been correctly written in at least one first register; and, in case the data has not been correctly written in the at least one first register, reading, by the memory control circuit, data from at least one second register of the one-time programmable memory.

One embodiment provides an integrated circuit comprising a one-time programmable memory; and a memory control circuit configured to attempt to write data in at least one first register of the one-time programmable memory; verify whether the data has been correctly written in the at least one first register; and, in case the data has not been correctly written in the at least one first register, attempt to write the data in at least one second register of the one-time programmable memory.

One embodiment provides an integrated circuit comprising a one-time programmable memory; and a memory control circuit configured to verify whether data has been correctly written in at least one first register; and, in case the data has not been correctly written in the at least one first register, read data from at least one second register of the one-time programmable memory.

According to one embodiment, the one-time programmable memory comprises a first group of write-protected memory cells; and a second group of write-enabled memory cells, comprising the at least one first register and the at least one second register.

According to one embodiment, the first group of write-protected memory cells and the second group of write-enabled memory cells are part of a single memory array.

According to one embodiment, the chip further comprises a communications interface suitable for communicating with a programming system.

One embodiment provides a chip customization system, comprising the chip; and a programming system.

According to one embodiment, the programming system comprises a power supply configured to supply power to the chip; a control system; and a communications interface suitable for communicating with the chip.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
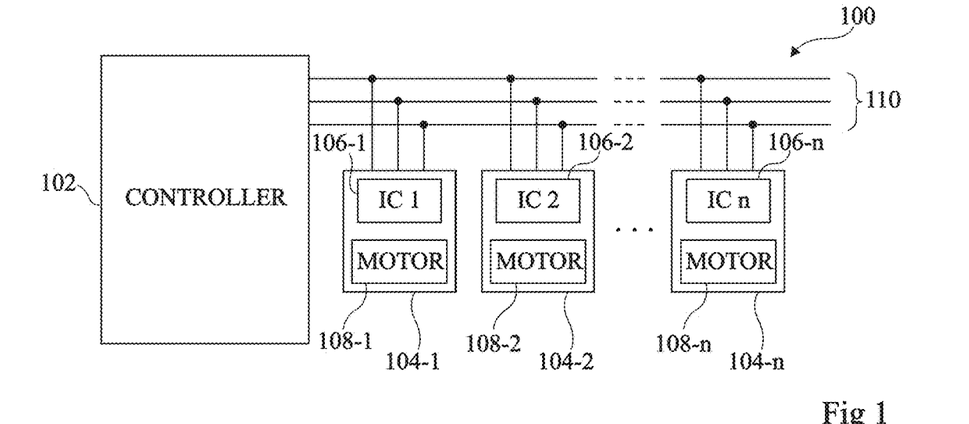
FIG. 1 schematically shows, in the form of blocks, an example of an electronic system of the type to which the described embodiments apply.

FIG. 1 schematically shows, in the form of blocks, an example of an electronic system 100 of the type to which the described embodiments are for example applied.

In this example, the electronic system 100 comprises a controller 102 (CONTROLLER). The controller 102 is, for example, a microcontroller or microprocessor adapted to control a heating, ventilation and air conditioning (HVAC) system of a motor vehicle, such as a car.

The electronic system 100 further comprises n elements 104-1, 104-2, . . . , 104-n, with n being for example equal to 1 or more, and equal to 4 in one example. In the example of a car HVAC system, the elements 104-1, 104-2, 104-n for example each represents a unit that is suitable for driving a flap (not shown in FIG. 1) of the HVAC system.

In this example, each unit 104-1, 104-2, 104-n comprises an integrated circuit 106-1 (IC 1), 106-2 (IC 2), 106-n (IC n). The integrated circuits 106-1, 106-2, 106-n are for example each configured to control a motor (MOTOR) 108-1, 108-2, 108-n. The motors 108-1, 108-2, 108-n are for example configured to open and close the flap with which they are associated.

In the example of FIG. 1, the elements 104-1, 104-2, 104-n are all coupled to the controller 102 via a bus 110. In the case that the electronic system 100 is integrated in a motor vehicle, the bus 110 is typically a Control Area Network (CAN), a Serial Peripheral Interface (SPI) or a Local Interconnect Network (LIN) bus. The bus 110 allows the controller 102 to communicate with the integrated circuit 106-1, 106-2, 106-n of each element 104-1, 104-2, 104-n and/or to receive feedback from each integrated circuit.

The integrated circuits 106-1, 106-2, 106-n for example provide different functions from each other. When the electronic system 100 is embedded in a motor vehicle, each integrated circuit 106-1, 106-2, 106-n may be customized, for example, in order to allow it to be individually addressed using the bus no and/or so as to meet requirements of the flap that it is meant to drive. Such a customization is generally performed either during an assembly step (mechatronics approach) of the motors 108-1, 108-2 and 108-n, or at the end of a production line (standard approach). In the latter case, the integrated circuits 106-1, 106-2 and 106-n are for example programmed using a main electronic control unit (ECU, not shown) of the motor vehicle.

Figure 2:
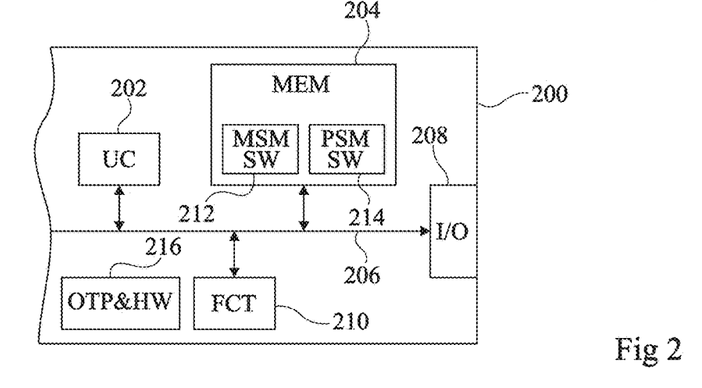
FIG. 2 schematically shows, in the form of blocks, an example of an electronic circuit.

FIG. 2 schematically shows, in the form of blocks, an example of an electronic circuit 200, or chip. For example, a circuit corresponding to the circuit 200 is used to implement each of the integrated circuits 106-1, 106-2, 106-n of FIG. 1, although the circuit 200 may have other applications.

In this example, the electronic circuit 200 comprises a control unit 202 (UC), for example, a state machine, a microprocessor, a programmable logic circuit, etc.; one or more volatile and/or non-volatile storage areas 204 (MEM) for storing data; one or more data, address, and/or control buses 206 between the different elements of the circuit 200; and an input-output interface 208 (I/O) for communicating with devices (not illustrated) that are external to the electronic circuit 200.

The electronic circuit 200 may include various other elements or circuits according to the application, symbolized in FIG. 2 by a block 210 (FCT).

In this example, the memory 204 of the circuit 200 comprises two areas 212 (MSM SW) and 214 (PSM SW). The areas 212 and 214 are for example each adapted to store software instructions for implementing various functions. Although only areas 212 and 214 are shown in FIG. 2, the memory 204 may comprise other areas.

The electronic circuit 200 further comprises a one-time programmable memory 216 (OTP&HW).

Figure 3:
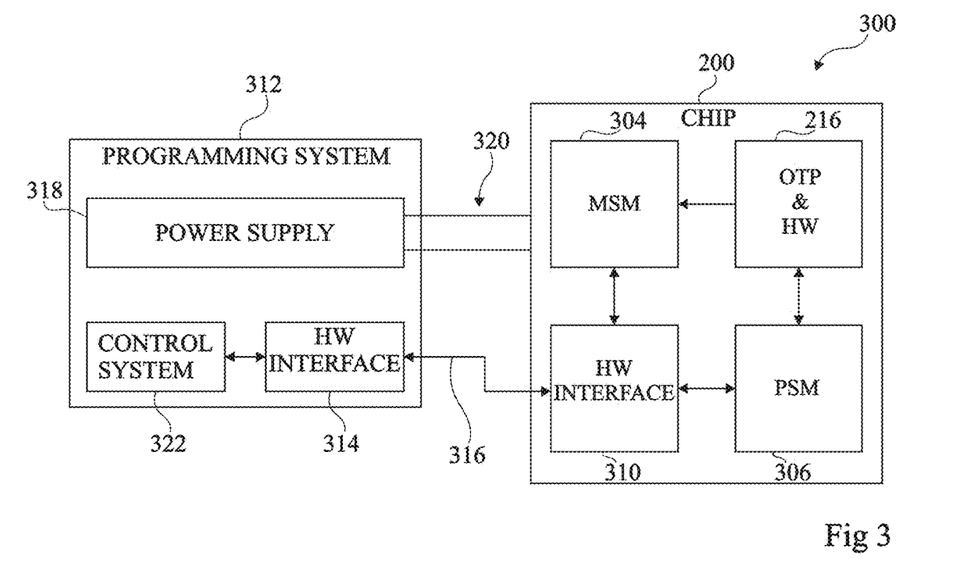
FIG. 3 schematically illustrates, in the form of blocks, an embodiment of an electronic system.

FIG. 3 schematically illustrates, in the form of blocks, an embodiment of an electronic system 300.

The electronic system 300 comprises the electronic circuit 200 (CHIP). The circuit 200 for example corresponds to one of the integrated circuits 106-1, 106-2, 106-n of the electronic system 100 of FIG. 1. The circuit 200 comprises a state machine 304 (MSM); a memory control circuit 306 (PSM), for example a state machine; the one-time programmable memory 216 (OTP&HW); and a hardware interface 310 (HW INTERFACE), which is for example part of the input-output interface 208 (FIG. 2).

The state machine 304 is, for example, a main state machine of the circuit 200. As shown in FIG. 3, the state machine 304 is coupled to the one-time programmable memory 216 and to the hardware interface 310. The main state machine 304 for example applies trimming values, which may be stored inside the one-time programmable memory 216, and executes control algorithms of the electronic circuit 200, for example in order to operate an associated motor in a desired manner in response to input commands. The state machine 304 for example executes the software that is stored in the area 212 of the memory 204 (FIG. 2).

The state machine 306 is, for example, a state machine that is configured or dedicated to executing operations in order to program and check memory cells of the one-time programmable memory 216. As shown in FIG. 3, the state machine 306 is for example coupled to the one-time programmable memory 216 and to the hardware interface 310. The state machine 306 for example drives hardware components for programming and checking programmed cells of the one-time programmable memory 216. The second state machine 306 for example executes the software that is stored inside the area 214 of the memory 204 (FIG. 2).

Alternatively, the state machines 304 and 306 may be implemented by hardware components only. In such a case, the areas 212 and 214 of the memory 204 may be omitted.

The one-time programmable memory 216 is, for example, used for customization of functions that are provided by the circuit 200. In one example, the one-time programmable memory 216 is used to select specific features that the circuit 200 is to perform, such as a type of flap of a vehicle HVAC system (not shown) which is to be controlled by the circuit 200.

The electronic system 300 of FIG. 3 for example comprises a programming system 312 (PROGRAMMING SYSTEM), which is coupled to the circuit 200 during a programming phase of the one-time programmable memory 216. For example, the hardware interface 310 of the circuit 200 is coupled to a hardware interface 314 (HW INTERFACE) of the programming system 312 via a bidirectional communications bus 316. The communications bus 316 is, for example, a LIN (Local Interconnect Network) bus.

The circuit 200 is further coupled to a power supply 318 (POWER SUPPLY) of the programming system 312, which is for example used to power the circuit 200 during a programming phase. For example, the power supply 318 of the programming system 312 is coupled to the circuit 200 via a power supply link 320. In one embodiment, power supply link 320 supplies a DC voltage of approximately 18 V from the power supply 318 to the components of the circuit 200.

The programming system 312 further comprises a control system 322 (CONTROL SYSTEM). The control system 322 is, for example, a computer or a work station. The control system 322 for example drives the hardware interface 314, which is used for communicating between the programming system 312 and the circuit 200.

One advantage of the electronic system 300 lies in the fact that the circuit 200 comprises a one-time programmable memory 216 that is configured to be programmed, during a first programming phase, only partially, leaving at least some memory cells that can be programmed at a later time. The use of a one-time programmable memory 216 allows the cost of the circuit 200 to be reduced compared to, for example, similar chips embedding multiple-time programmable (MTP) memory, such as for example electrically-erasable programmable read-only memory (EEPROM) or flash memory, few-time programmable (FTP) memory, etc., instead of the one-time programmable memory 216. This enables to achieve economies of scale, for example in the automotive industry, as the fact of using a large one-time programmable memory induces lower production costs than using for example a small MTP memory.

Figure 4:
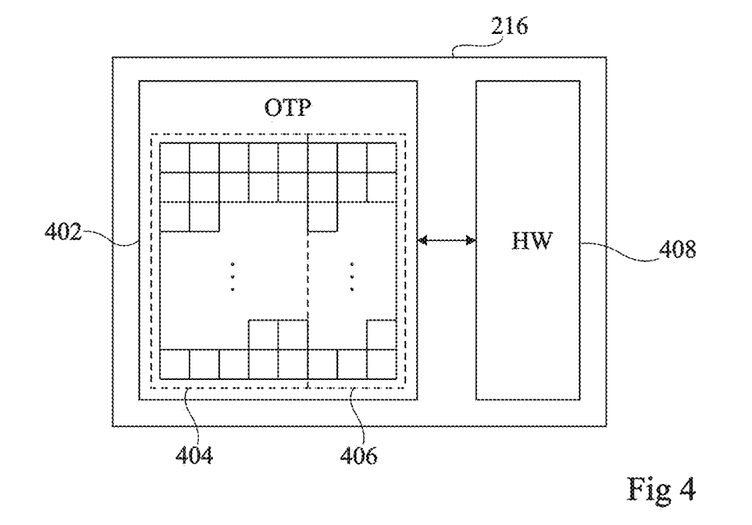
FIG. 4 schematically illustrates, in the form of blocks, an embodiment of a one-time programmable memory.

FIG. 4 schematically illustrates, in the form of blocks, an embodiment of the one-time programmable memory 216 of the circuit 200 of FIG. 3. For example, the one-time programmable memory 216 has been subjected to a partial programming phase, during which some of the memory cells have been programmed, and other not.

The one-time programmable memory 216 comprises, as depicted in FIG. 4, a memory array 402 (OTP) that is an array of memory cells. According to one embodiment, the array 402 of the one-time programmable memory 216 comprises a group 404 of write-protected memory cells and a group 406 of write-enabled memory cells. According to this embodiment, write-enabled memory cells of the group 406 are suitable for customization by a user of the circuit 200.

In practice, as shown in FIG. 4, the group 404 of write-protected memory cells and the group 406 of write-enabled memory cells may for example be part of a single memory array.

In some embodiments, the group 404 of write-protected memory cells is used to store trimming values for trimming operation of the integrated circuit 200, or other data that is for example programmed following manufacture, and cannot be customized later.

In some embodiments, as will be described in more detail in the following description, the group 406 of write-enabled memory cells is used for storing custom data. In the example where each element 104-1, 104-2 and 104-n (FIG. 1) comprises a memory that is the same as the one-time programmable memory 216 of FIG. 4, the data stored in the group 406 of write-enabled memory cells of each element 104-1, 104-2 and 104-n is for example different to the data stored by the other elements. For example, in some embodiments, the group 406 of write-enabled memory cells stores an address of the corresponding element 104-1, 104-2, 104-n on the bus 110, and/or data that is specific to the features of the motor 108-1, 108-2, 108-n (FIG. 1) to be driven by the corresponding element 104-1, 104-2, 104-n. More generally, the group 406 of write-enabled memory cells may store any data that may be customized, for example according to the needs of a manufacturer of the element 104-1, 104-2, 104-n.

The one-time programmable memory 216 may further comprise, as shown in FIG. 4, a hardware module 408 (HW). The hardware module 408 is for example coupled to the memory cells array 402. The hardware module 408 is for example configured to execute operations that are dedicated to programming and checking the memory cells of the array 402. For example, the hardware module 408 is implemented by a dedicated digital circuit, such as an ASIC (application-specific integrated circuit), although in alternative embodiments the functions of the module 408 could at least partially be implemented in software executed by a suitable processor.

The one-time programmable memory 216 having the group 406 of write-enabled memory cells copes with customer demands of individualized products, configurable for example by an automotive supplier or by a car manufacturer, while being easily scalable and available at low cost.

Figure 5:
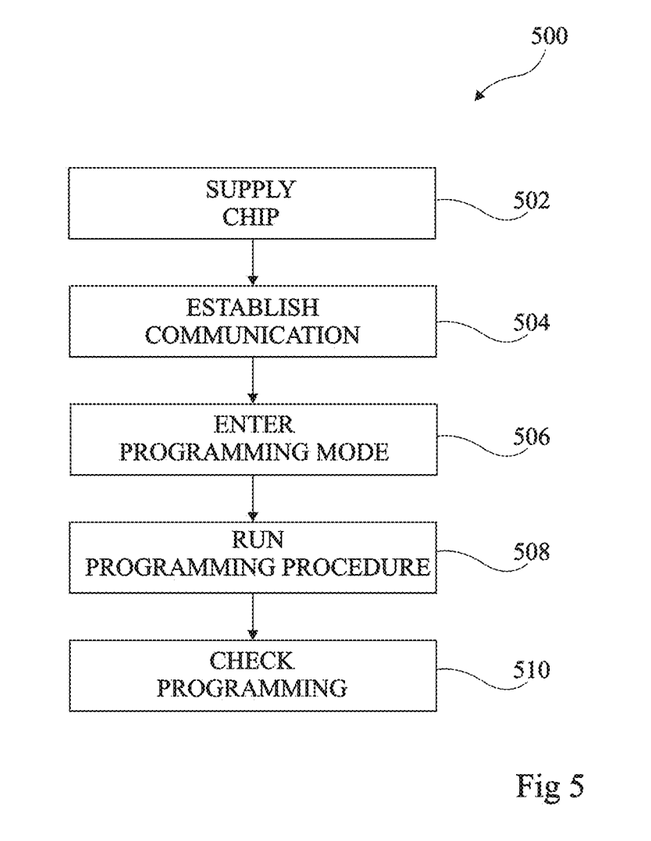
FIG. 5 is a flow diagram of a method for programming the one-time programmable memory of the chip of FIG. 3.

FIG. 5 is a flow diagram of a method 500 for programming the one-time programmable memory 216 of the circuit 200 of FIG. 3. The method of FIG. 5 is for example implemented in part by the control system 322 of the programming system 312 of FIG. 3, and in part by the hardware module 408 of FIG. 4. The method of FIG. 5 is for example a method for programming the group 406 of write-enabled memory cells of the memory 216.

For example, in the case of the system of FIG. 1, the method 500 is for example used to program the OTP of each of the integrated circuits 106-1, 106-2, 106-n, in turn, prior to coupling these circuits to the bus 110.

In an operation 502 of the method 500, the circuit 200 (FIG. 3) is electrically powered using the power supply 318 of the programming system 312. In practice, the power is supplied to the circuit 200 via the power supply link 320.

In an operation 504 of the method 500, following the operation 502, the programming system 312 establishes communication with the circuit 200. In practice, the communication is established via the communications bus 316 (FIG. 3).

In an operation 506 of the method 500, following the operation 504, the circuit 200 and the programming system 312 enter a programming mode. Entering the programming mode, as will be described in more detail with respect to FIGS. 6 to 8, for example allows the programming system 312 to write data into the group 406 of write-enabled memory cells of the one-time programmable memory 216 (FIG. 3).

In an operation 508 of the method 500, following the operation 506, the programming system 312 for example performs a programming procedure of the one-time programmable memory 216. The programming procedure for example aims at customizing the circuit 200 by writing data into the group 406 of write-enabled memory cells of the one-time programmable memory 216.

In an operation 510 of the method 500, the programming of the one-time programmable memory 216 that has been performed during the operation 508 is for example checked. For example, the data that has previously been written during the operation 508 is read back and compared to the original data so as to verify that no mistake has been made during the programming operation 508.

The operations of the method 500 of FIG. 5 will now be described in more detail with reference to FIGS. 6 to 8.

Figure 6:
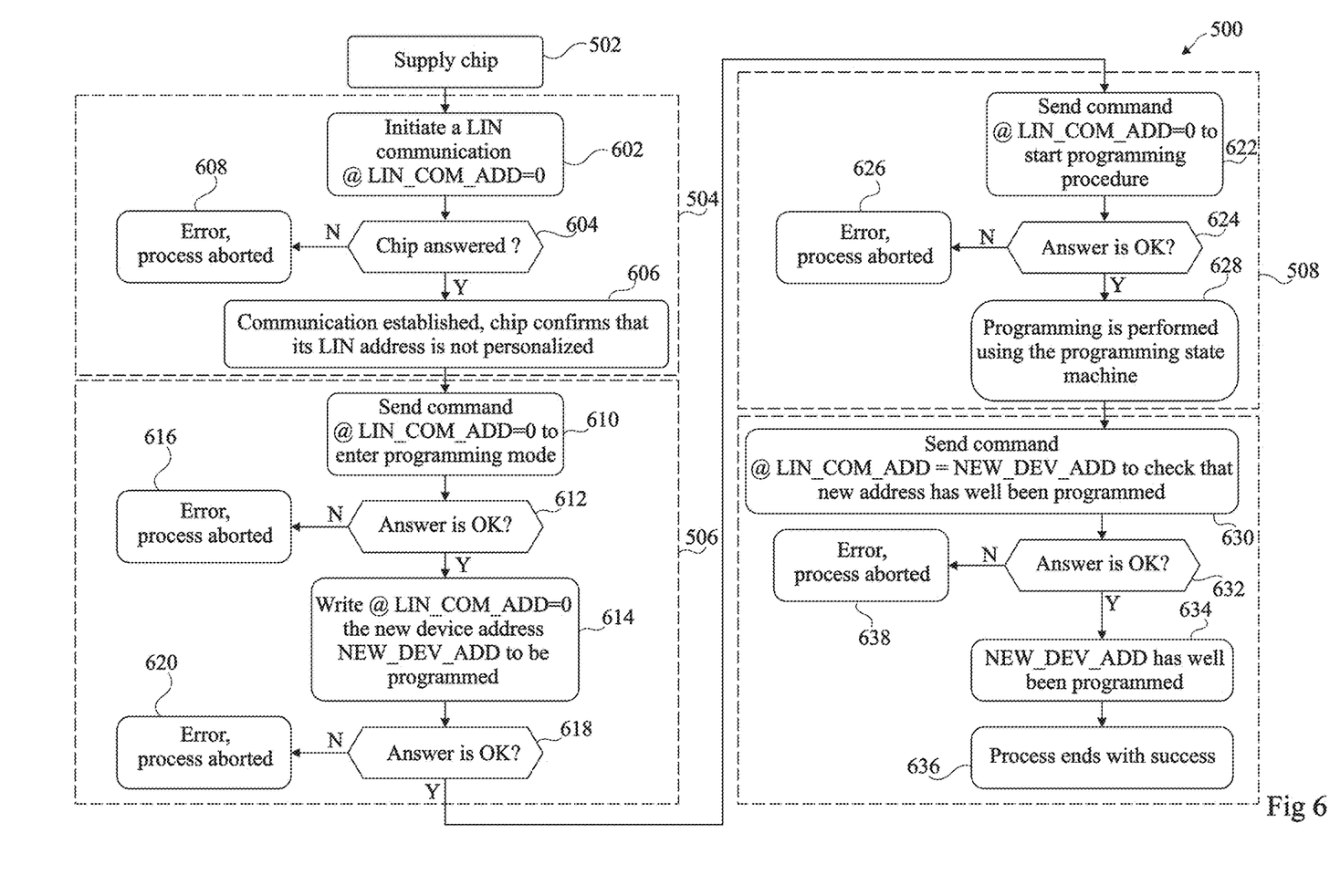
FIG. 6 is a flow diagram illustrating in more detail operations of the method of FIG. 5.

FIG. 6 is a flow diagram illustrating, in more detail, operations of the method 500 of FIG. 5. By way of simplification, FIG. 6 illustrates the method 500 applied to a case where only one piece of information, for example an address of the circuit 200 for communicating on the bus 316 (FIG. 3), is customized in the one-time programmable memory 216. Such an address is referred to as a "LIN address" in the following description, corresponding to an example in which the communications bus 316 is a LIN bus, although other types of bus would be possible.

A first operation in FIG. 6 is the operation 502 of FIG. 5, already described above. The circuit 200 is typically powered by an 18 V DC voltage, which is for example compatible with BCD (Bipolar-CMOS-DMOS) technology, that is a technology combining bipolar complementary MOS technology and double-diffused MOS technology.

When supplied, the circuit 200 powers up. The programming system 312 then waits for a fixed time duration, for example 100 ms, before starting operation 504, in order for example to permit execution of an initialization phase.

During the initialization phase, the state machine 304 of the circuit 200 (FIG. 3) for example powers-up, then reads the one-time programmable memory 216. For example, the state machine 304 reads the LIN address, called OTP_DEV_ADD, of the circuit 200. The LIN address OTP_DEV_ADD of the circuit 200 is stored, for example, in the group 406 of write-enabled cells of the one-time programmable memory 216. Assuming that the one-time programmable memory 216 is customized for the first time, the value of the LIN address OTP_DEV_ADD is for example equal to zero.

The main state machine 304 then for example copies the value of the LIN address OTP_DEV_ADD into a variable called LIN_DEV_ADD. The LIN_DEV_ADD represents a LIN address value used by a LIN protocol handler of the circuit 200 in order to identify its address on the LIN interface 316. The LIN protocol handler is, for example, part of the hardware interface 310 of the circuit 200.

The circuit 200 is then for example switched to idle mode and waits for a LIN communication to occur.

In the operation 504 of the method 500, after the waiting time has expired, the programming system 312 for example initiates, in an operation 602, a LIN communication, that is a communication using the LIN bus 316. For example, the programming system tries to communicate at a LIN address LIN_COM_ADD, the value of which is equal to the value of the address LIN_DEV_ADD of a chip that the programming system 312 tries to communicate with. In this example, the programming system 312 tries to communicate with the circuit 200, whose address LIN_DEV_ADD is equal to zero. The programming system 312 thus sets the value of LIN_COM_ADD to zero.

The operation 602 also for example involves sending, by the programming system 312, a communication request, which is received by the LIN protocol handler of the circuit 200. After checking that the address LIN_DEV_ADD value is equal to zero, the circuit 200 for example accepts the communication request and the LIN protocol handler then for example responds to the LIN communication.

The programming system 312 then for example checks, in an operation 604, that the circuit 200 has correctly responded to the communication request. In such a case (output Y), in an operation 606 the communication is considered to be established and the chip confirms, in this way, that its LIN address OTP_DEV_ADD is not customized. Otherwise, if in operation 604 the circuit 200 does not respond correctly (output N), the process is aborted in an operation 608.

The operation 506 for example involves an operation 610, in which the programming system 312 sends a command to the circuit 200 in order to enter the programming mode. For example, the command to enter the programming mode is sent while keeping the address LIN_COM_ADD equal to zero in order to reach the one-time programmable memory 216 of the circuit 200. On the side of the circuit 200, the command to enter the programming mode is for example received by the LIN protocol handler.

In practice, the command to enter the programming mode may, for example, be sent by writing a keyword into a LIN register of the circuit 200. The writing of the keyword into the LIN register may for example be repeated twice for safety reasons.

When the command to enter the programming mode has been accepted by the circuit 200, the programming mode is entered and the LIN protocol handler acknowledges that the command has been correctly received and executed. In an operation 612, the programming system then for example waits for the circuit 200 to send an acknowledgement.

If, in operation 612, the circuit 200 sends an acknowledgement (output Y), in an operation 614 a command, which for example comprises data to be written, is then for example sent, by the programming system 312, to the circuit 200. Otherwise, if in operation 612 the circuit 200 does not acknowledge the reception of the command (output N), the process is for example aborted in an operation 616.

The command for example aims at writing a value NEW_DEV_ADD into the LIN register of the circuit 200. In some embodiments, the command is received by the circuit 200, which then checks that the address LIN_DEV_ADD is equal to zero and that the programming mode is active. In such a case, the command is accepted by the circuit 200, the value of the address NEW_DEV_ADD is for example written into the LIN register and the LIN protocol handler for example sends an acknowledgement to the programming system 312. Otherwise, for example if the programming mode is not active, the LIN protocol handler for example responds with an error code.

The programming system 312 then for example checks, in an operation 618, that the circuit 200 has acknowledged the command. If so (output Y), the circuit 200 is considered to be ready to run the programming procedure 508. Otherwise (output N), the process is for example aborted in an operation 620.

In the operation 508 of the method 500, the programming system 312 for example sends, in an operation 622, a command to the circuit 200 in order to start the programming procedure. For example, the command to start the programming procedure is received by the LIN protocol handler of the circuit 200. In practice, the command is for example sent by flipping a bit of the LIN register, such a bit being writeable in programming mode only. The circuit 200 then for example checks that the address LIN_DEV_ADD is equal to zero, that the programming mode is active and that the value of the address NEW_DEV_ADD is different from zero. In such a case, the command to start the programming procedure is for example accepted and the circuit 200 for example sends an acknowledgment to the programming system 312. Otherwise, for example if the programming mode is not active or if the NEW_DEV_ADD is equal to zero, the LIN protocol handler responds to the programming system 312 with an error code.

The programming system 312 then for example checks, in an operation 624, that the circuit 200 has acknowledged the command to start the programming procedure. If so, (output Y), the circuit 200 is considered to be ready to perform the programming. Otherwise (output N), the process is for example aborted in an operation 626.

Assuming that the circuit 200 is ready to start the programming procedure, the programming of the one-time programmable memory 216 is then for example performed in an operation 628 using the state machine 306 of FIG. 3. An example of the programming operation 628 will be described in more detail below with reference to FIGS. 7 and 8.

The programming system 312 then for example waits for a fixed time duration, for example 100 ms, before starting the operation 510. Such a time duration for example allows the programming of the one-time programmable memory 216 of the circuit 200 to be performed during the programming phase 508.

After the waiting time has expired, the programming system 312 for example sends, in an operation 630, a command to the circuit 200 in order to check that the new address NEW_DEV_ADD has been correctly programmed into the one-time programmable memory 216. For example, the command is received by the LIN protocol handler and the circuit 200 checks that the value of the address LIN_DEV_ADD is equal to the value of the address NEW_DEV_ADD. If it is, the command is for example accepted and the LIN protocol handler for example sends an acknowledgment to the programming system 312.

The programming system 312 then for example checks, in an operation 632, that the circuit 200 has acknowledged the command to check the result of the programming procedure. If it has (output Y), in an operation 634 the circuit 200 is considered to have been programmed correctly. If the programming procedure ends normally, that is if the address NEW_DEV_ADD is considered to have been written correctly into the memory 216, in an operation 636, the method 500 is considered successful. Otherwise, if in operation 632 it is determined that the circuit 200 has not acknowledged the command (output N), the process is for example aborted in an operation 638.

Figure 7:
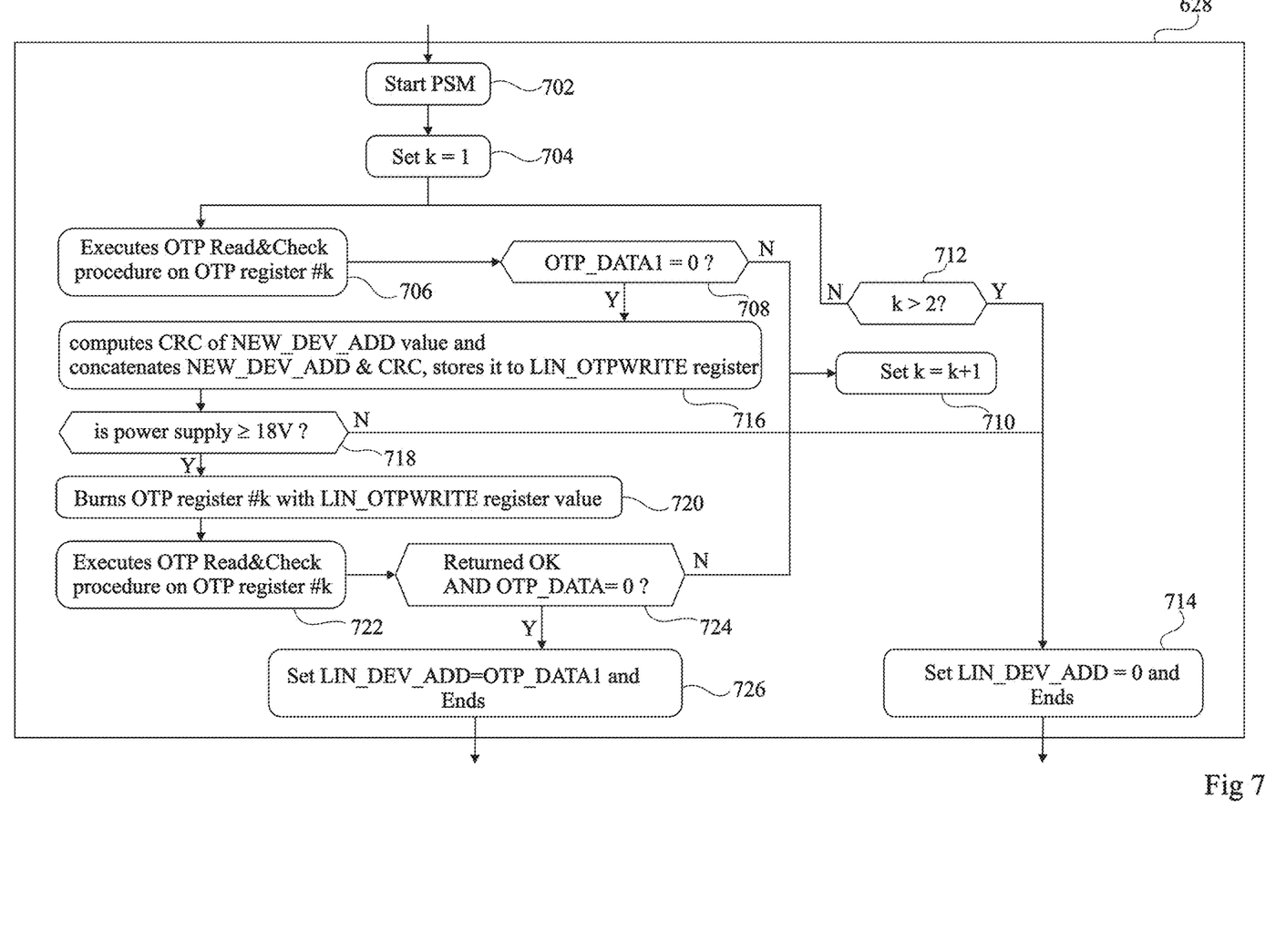
FIG. 7 is a flow diagram illustrating in more detail one of the operations of the method of FIG. 6.

FIG. 7 is a flow diagram illustrating, in more detail, one of the operations of the method 500 of FIG. 6. More precisely, FIG. 7 illustrates the operation 628 of the method 500, in which the programming of the one-time programmable memory 216 is performed.

At the beginning of operation 628, in an operation 702 of FIG. 7, the state machine 306 (FIG. 3) of the circuit 200 is started.

A counter k is then set to the value 1 in an operation 704. The counter k is used for sweeping through registers of the one-time programmable memory 216.

A procedure is then executed in an operation 706 so as to read and check a content of the $k^{th}$ register of the one-time programmable memory 216. The execution of the read and check procedure of operation 706 will be described in more detail below with reference to FIG. 8. With k being equal to 1 at this stage, the content of the first register of the memory 216 is thus read and checked.

The one-time programmable memory 216 for example has a register format comprising a first region OTP_DATA1, which is used for storing data, such as the address OTP_DEV_ADD in the present example, which aims at modifying this address; and a second region OTP_DATA2, which is used for storing a verification code, for example a cyclic redundancy check (CRC) code, of the data. Indeed, in the present example, the region OTP_DATA2 stores the CRC of the address OTP_DEV_ADD.

In the case that the execution of the read and check procedure in operation 706 is successful, the value of the first region OTP_DATA1 of the first register is then tested in an operation 708. Assuming that the value of the first region OTP_DATA1 of the first register and the value of the second region OTP_DATA2 of the first register are both equal to zero at this stage (output Y), it is thus considered that the first register is blank.

Otherwise, if in operation 708 it is found that the first region OTP_DATA1 and/or the second region OTP_DATA2 are not equal to zero (output N), the counter k is incremented in an operation 710. It is then checked, in an operation 712, whether the value of the counter k is equal to three or more. With k being equal to two at this stage of the flow diagram, k is not yet equal to three, and the memory 216 repeats the operations 706 and 708. This gives the opportunity to program the second register if the first register was initially not blank.

If again, in operation 708, the first region OTP_DATA1 and/or the second region OTP_DATA2 of the second register are not equal to zero (output N), the counter k is then incremented again in operation 710. It is then checked again in operation 712 whether the value of the counter k is equal to three or more. With k being equal to three at this stage of the flow diagram, in an operation 714 the address LIN_DEV_ADD is set to zero and the programming ends.

However, assuming that, in operation 708, the first region OTP_DATA1 and the second region OTP_DATA2 of the first register are both equal to zero (output Y), during a further operation 716, the CRC code of the value of the address NEW_DEV_ADD is computed; the value of the address NEW_DEV_ADD is concatenated with its CRC code; and the result of the concatenation is stored into a register called LIN_OTPWRITE.

It is then for example checked, in an operation 718, that the voltage that is supplied to the circuit 200 is at a certain level, equal to 18 V in this example. In such a case (output Y), the $k^{th}$ OTP register (the first OTP register, at this stage) is then burnt in an operation 720 with the LIN_OTPWRITE register value. Otherwise (output N), the address LIN_DEV_ADD is set to zero and the programming ends in an operation 714.

Assuming that the first OTP register now contains the value LIN_OTPWRITE after performing the operation 720, a read and check procedure is performed again, in an operation 722, on the contents of the first OTP register. The procedure that is performed during operation 722 is for example identical to the one that is performed during operation 706.

It is then checked, in an operation 724, that the execution of the read and check procedure in operation 722 was successful and that the value of the first region OTP_DATA1 of the first register is different from zero. In such a case (output Y), the address LIN_DEV_ADD is set equal to the first region OTP_DATA1 of the first register and the programming ends in an operation 726. The data that has been stored into the first register is thus considered as valid.

Otherwise, if in operation 724 it is found that the read and check procedure of operation 722 was not successful (output N), the data that has been stored into the first register is considered as corrupted. The counter k is then incremented in an operation 710 so as to give the opportunity to program the second register with a correct value.

Although the flow diagram of FIG. 7 illustrates a method which allows two programming attempts of the same data to be successively made, it will be apparent to those skilled in the art that this method could be adapted to allow any number of attempts greater than two.

Figure 8:
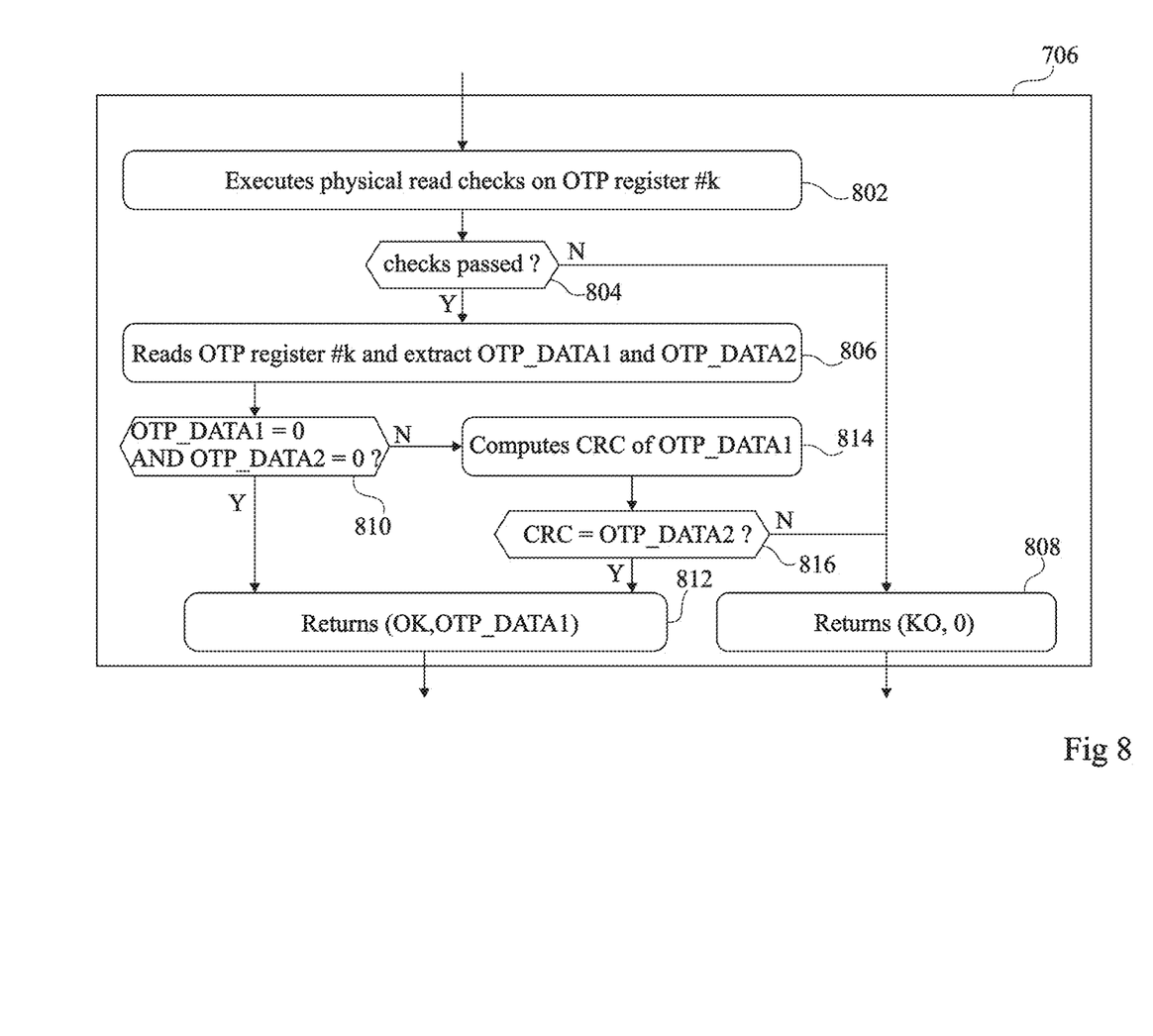
FIG. 8 is a flow diagram illustrating in more detail one of the operations of the flow diagram of FIG. 7.

FIG. 8 is a flow diagram illustrating, in more detail, the operation 706 of FIG. 7. For the sake of simplicity, it will be assumed that k is equal to one at this stage.

The read and check procedure 706 starts by executing, in an operation 802, physical read checks on the $k^{th}$ OTP register (the first OTP register, in this example). In practice, the physical read checks may consist in checking the correct reading of the electrical values, e.g. resistance values, of at least some of the one-time programmable memory cells by using stricter thresholds than those applied during normal read operations of the OTP. For example, the acceptable resistance ranges for each programmed state are for example narrower than the range of resistances that will be read as each state during a normal read operation. This check is, for example, performed using the state machine 306.

It is then verified in an operation 804 whether the physical read checks were successful. If so (output Y), the first OTP register is then read in an operation 806 so as to obtain the contents of its first region OTP_DATA1 and the contents of its second region OTP_DATA2. Otherwise (output N), the physical reads and checks end in an operation 808 and the data stored inside the first OTP register is considered as corrupted.

Assuming that the physical read checks have been successful and that the first region OTP_DATA1 and the second region OTP_DATA2 of the first register have been extracted, it is then checked in an operation 810 that these two regions are both equal to zero. In such a case (output Y), the read and check procedure ends successfully at an operation 812 and the data that is stored in the first region OTP_DATA1 of the first register is considered as valid. Otherwise (output N), the CRC code of the data that is stored in the first region OTP_DATA1 is computed in an operation 814.

The computed CRC code is then compared, in an operation 816, with the data that is stored in the second region OTP_DATA2. If the CRC code matches the data stored in the second region OTP_DATA2 (output Y), the procedure ends successfully at operation 812. Otherwise (output N), the data stored inside the first OTP register is considered as corrupted at operation 808 and the procedure ends.

In other words, the operation 706 comprises a hardware verification, by comparison of an electrical value of the OTP cells with thresholds, and a logical verification of the data that has been previously written to the OTP cells.

While the flow diagram described above in relation with FIG. 8 illustrates, as an example, the operation 706 of FIG. 7, those skilled in the art will be able to adapt the flow diagram of FIG. 8 in order to perform the operation 722 of FIG. 7.

One advantage of the one-time programmable memory 216 and of the method 500 lies in the fact that they allow a region of a one-time programmable memory to be programmed at a later stage than another region that has already been programmed. This allows, for example, a relatively low cost one-time programmable memory to be used instead of a few-time programmable memory 216.

Figure 9:
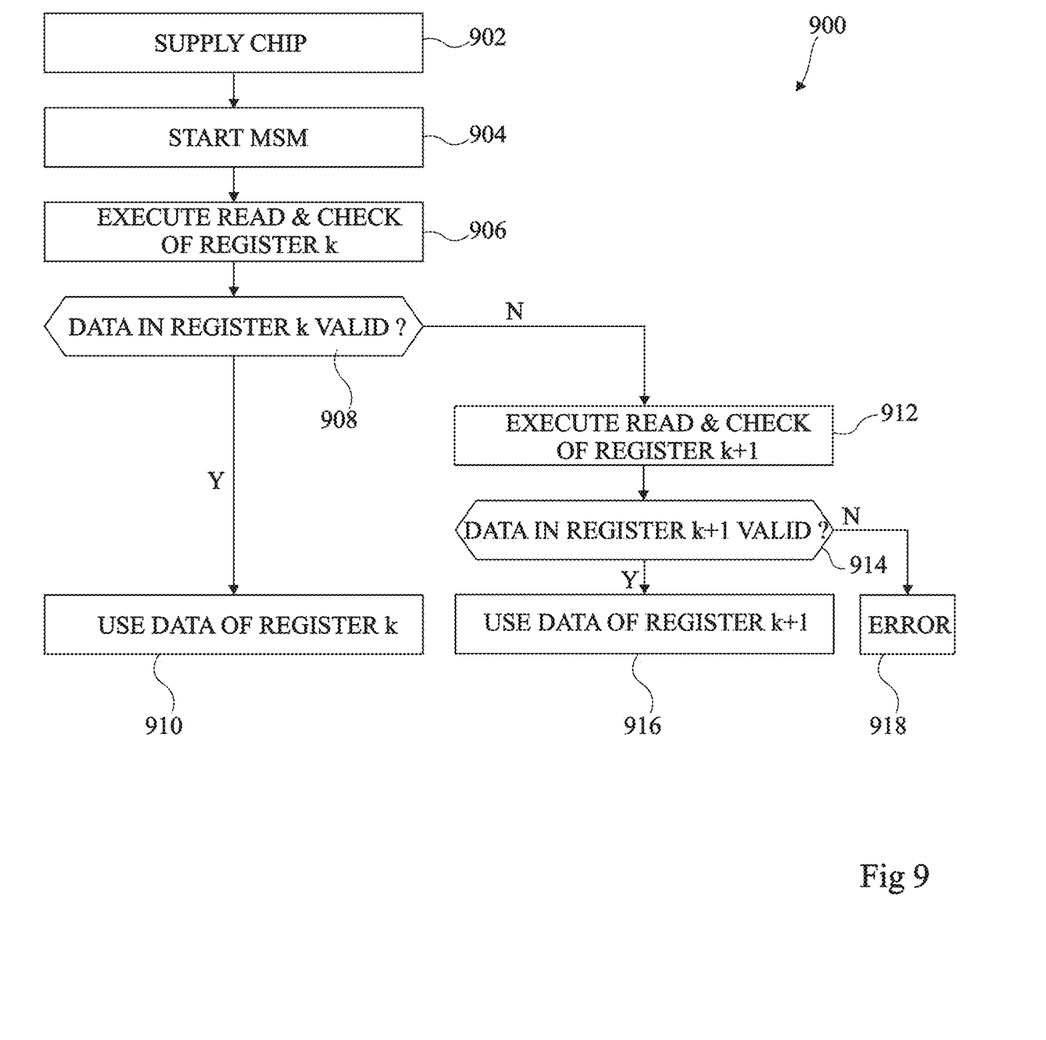
FIG. 9 is a flow diagram illustrating startup operations of the electronic circuit of FIG. 2.

FIG. 9 is a flow diagram 900 illustrating startup operations of the circuit 200 of FIG. 2. These operations are for example performed each time the circuit 200 is powered-up.

The startup operations begin with, in an operation 902, supplying power to the electronic chip 200. This causes, in an operation 904, the main state machine 304 of the chip 200 to start.

In this example, the read and check procedure 706 previously described with reference to FIG. 8 is then for example applied to the $k^{th}$ OTP register in an operation 906, with k starting again at 1. By executing the read and check procedure 706, it is verified, in an operation 908, whether the data stored in the $k^{th}$ register is valid. In such a case (output Y), the data stored in the $k^{th}$ register is used for further operations 910.

Otherwise, if the data stored in the $k^{th}$ register is considered, in view of the hardware verification and/or logical verification, to be corrupted (output N), the read and check procedure 706 is applied to the $k+1^{th}$ OTP register in an operation 912. By executing the read and check procedure 706, it is verified, in an operation 914, whether the data stored in the $k+1^{th}$ register is valid. In such a case (output Y), the data stored in the $k+1^{th}$ register is used for further operations 916.

Otherwise, if the data stored in the $k+1^{th}$ register is considered to be corrupted (output N), an error 918 for example occurs.

The example of FIG. 9 is based on an example in which two write attempts were allowed during the OTP programming phase. However, if more than two attempts were allowed, the number of registers to be checked may be higher.

Various embodiments and variants have been described. Those skilled in the art will understand that certain features of these embodiments can be combined and other variants will readily occur to those skilled in the art. In particular, the one-time programmable memory 216 may comprise more than one group 404 of write-protected memory cells and more than one group 406 of write-enabled memory cells.

Furthermore, example have been described in which a first attempt can be made to program a register of an OTP, and if this attempt fails, a second attempt can be made to program a further register. These registers can be of any size. Furthermore, it would also be possible to apply this method to blocks of registers, rather than to single registers. In other words, a first attempt can be made to program a block of r registers of an OTP, and if this attempt fails, a second attempt can be made to program a further block of r registers of the OTP, where r is equal to 2 or more.

Finally, the practical implementation of the embodiments and variants described herein is within the capabilities of those skilled in the art based on the functional description provided hereinabove. In particular, the state machines 304 and 306 may, in practice, be implemented by hardware only, by software only, or by a mixture of hardware and software.

What is claimed is:

1. A method for writing into a one-time programmable memory of an integrated circuit, the method comprising:
    attempting, by a memory control circuit of the integrated circuit, to write data in at least one first register of the one-time programmable memory;
    verifying, by the memory control circuit, whether the data has been correctly written in the at least one first register by verifying:
        hardware electrical values of the at least one first register; and
        a value of a verification code contained in the data written in the at least one first register; and
    in response to the data not being correctly written in the at least one first register, attempting, by the memory control circuit, to write the data in at least one second register of the one-time programmable memory.

2. The method of claim 1, further comprising, after attempting to write the data in the at least one second register, verifying, by the memory control circuit, whether the data has been correctly written in the at least one second register.

3. The method of claim 1, wherein:
    the method further comprises calculating the verification code by the memory control circuit prior to attempting to write the data in the at least one first register.

4. The method of claim 1, wherein the verifying the hardware electrical values of the at least one first register comprises:
    measuring, for at least some memory cells of the at least one first register, a respective electrical value; and
    comparing each measured electrical value with at least one threshold.

5. A method for reading a one-time programmable memory of an integrated circuit, the method comprising:
    verifying, by a memory control circuit, whether data has been correctly written in at least one first register by verifying:
        hardware electrical values of the at least one first register; and
        a value of a verification code contained in the data written in the at least one first register; and
    in response to the data not being correctly written in the at least one first register, reading, by the memory control circuit, data from at least one second register of the one-time programmable memory.

6. An integrated circuit comprising:
    a one-time programmable memory;
    a memory storage comprising instructions; and
    a memory control circuit coupled to the one-time programmable memory and the memory storage, the memory control circuit comprising a state machine, wherein the state machine executes the instructions, the instructions comprising:
        instructions for attempting to write data in at least one first register of the one-time programmable memory;
        instructions for verifying whether the data has been correctly written in the at least one first register by verifying:
            hardware electrical values of the at least one first register; and
            a value of a verification code contained in the data written in the at least one first register; and
        in case the data has not been correctly written in the at least one first register, instructions for attempting to write the data in at least one second register of the one-time programmable memory.

7. The integrated circuit of claim 6, wherein the one-time programmable memory comprises:
    a first group of write-protected memory cells; and
    a second group of write-enabled memory cells, comprising the at least one first register and the at least one second register.

8. The integrated circuit of claim 7, wherein the first group of write-protected memory cells and the second group of write-enabled memory cells are part of a single memory array.

9. The integrated circuit of claim 7, further comprising a communications interface configured to communicate with a programming system.

10. An integrated circuit customization system, comprising:
    the integrated circuit of claim 6; and
    a programming system configured to customize the integrated circuit.

11. The integrated circuit customization system of claim 10, wherein the programming system comprises:
    a power supply configured to supply power to the integrated circuit;
    a control system; and
    a communications interface configured to communicate with the integrated circuit.

12. The integrated circuit customization system of claim 10, wherein the one-time programmable memory comprises:
    a first group of write-protected memory cells; and
    a second group of write-enabled memory cells, comprising the at least one first register and the at least one second register.

13. The integrated circuit customization system of claim 12, wherein the integrated circuit further comprises a second communications interface configured to communicate with the programming system.

14. An integrated circuit comprising:
    a one-time programmable memory;
    a memory storage comprising instructions; and
    a memory control circuit coupled to the one-time programmable memory and the memory storage, the memory control circuit comprising a state machine, wherein the state machine executes the instructions, the instructions comprising:
        instructions for verifying whether data has been correctly written in at least one first register by verifying:
            hardware electrical values of the at least one first register; and
            a value of a verification code contained in the data written in the at least one first register; and
        in case the data has not been correctly written in the at least one first register, instructions for reading data from at least one second register of the one-time programmable memory.

15. The integrated circuit of claim 14, wherein the one-time programmable memory comprises:
   a first group of write-protected memory cells; and
   a second group of write-enabled memory cells, comprising the at least one first register and the at least one second register.

16. The integrated circuit of claim 15, wherein the first group of write-protected memory cells and the second group of write-enabled memory cells are part of a single memory array.

17. The integrated circuit of claim 15, further comprising a communications interface configured to communicate with a programming system.

18. An integrated circuit customization system, comprising:
   the integrated circuit of claim 14; and
   a programming system configured to customize the integrated circuit.

19. The integrated circuit customization system of claim 18, wherein the programming system comprises:
   a power supply configured to supply power to the integrated circuit;
   a control system; and
   a communications interface configured to communicate with the integrated circuit.

20. The integrated circuit customization system of claim 18, wherein the one-time programmable memory comprises:
   a first group of write-protected memory cells; and
   a second group of write-enabled memory cells, comprising the at least one first register and the at least one second register.

21. The integrated circuit customization system of claim 20, wherein the integrated circuit further comprises a second communications interface configured to communicate with the programming system.

* * * * *